(12) United States Patent
Freimann (10) Patent No.: US 8,908,149 B2
(45) Date of Patent: Dec. 9, 2014

(54) PROJECTION EXPOSURE SYSTEM AND USE THEREOF

(75) Inventor: Rolf Freimann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 694 days.

(21) Appl. No.: 12/251,132

(22) Filed: Oct. 14, 2008

(65) Prior Publication Data

US 2009/0097000 A1 Apr. 16, 2009

Related U.S. Application Data

(63) Continuation of application No. PCT/EP2007/003605, filed on Apr. 24, 2007.

(30) Foreign Application Priority Data

Apr. 24, 2006 (DE) .......................... 10 2006 018 928

(51) Int. Cl.
 *G03F 7/20* (2006.01)
(52) U.S. Cl.
 CPC ........ *G03F 7/70308* (2013.01); *G03F 7/70233* (2013.01)
 USPC ................... 355/66; 355/52; 355/53; 355/55; 355/67; 355/71
(58) Field of Classification Search
 USPC ........... 355/52, 53, 55, 67–71, 77, 40, 46, 60, 355/65, 66; 250/492.1, 492.2, 492.22, 548; 359/279, 300, 338, 580, 584–588; 430/5, 8, 22, 311, 312
 See application file for complete search history.

(56) References Cited

U.S. PATENT DOCUMENTS

| | | | |
|---|---|---|---|
| 3,656,849 A * | 4/1972 | Lu ..................................... | 355/46 |
| 4,322,130 A * | 3/1982 | Ito et al. .......................... | 359/584 |
| 5,436,114 A | 7/1995 | Itoo et al. | |

(Continued)

FOREIGN PATENT DOCUMENTS

| | | |
|---|---|---|
| DE | 102 20 324 | 11/2003 |
| EP | 1 387 220 | 2/2004 |

(Continued)

OTHER PUBLICATIONS

Paul Gräupner et al., "Solutions for printing sub 100nm contacts with ArF," Proceedings of the SPIE—The International Society for Optical Engineering, vol. 4691, Jul. 2002, pp. 503-514.

(Continued)

*Primary Examiner* — Toan Ton
*Assistant Examiner* — Christina Riddle
(74) *Attorney, Agent, or Firm* — Fish & Richardson P.C.

(57) ABSTRACT

A lithography method is proposed employing a projection exposure system having a catoptric imaging optics comprising a mirror formed as phase mask in the imaging beam path, wherein the mirror formed as phase mask exhibits continuous regions having dielectric layers provided thereon. Optionally, the regions of the mirror formed as phase mask are configured such that an axial extension of an image of a point (DOF) of the imaging is increased or/and a lateral extension of an image of a point of the imaging is decreased. Preferably multiple exposures of a same radiation sensitive substrate are performed in order to achieve an increase in resolution and scaling down of the manufacturing trace structures (61, 61'), respectively.

20 Claims, 7 Drawing Sheets

(56) References Cited

U.S. PATENT DOCUMENTS

| | | | |
|---|---|---|---|
| 5,448,336 A | 9/1995 | Shiraishi | |
| 5,552,856 A | 9/1996 | Shiraishi et al. | |
| 5,563,012 A | 10/1996 | Neisser | |
| 5,610,684 A | 3/1997 | Shiraishi | |
| 5,777,793 A * | 7/1998 | Little et al. | 359/584 |
| 5,863,712 A | 1/1999 | Von Bunau et al. | |
| 5,917,845 A | 6/1999 | Sales et al. | |
| 5,917,854 A | 6/1999 | Taylor et al. | |
| 5,972,568 A * | 10/1999 | Seniuk et al. | 430/312 |
| 6,404,482 B1 | 6/2002 | Shiraishi | |
| 6,485,891 B1 | 11/2002 | Noguchi et al. | |
| 6,544,721 B1 * | 4/2003 | Saitoh | 430/312 |
| 6,569,605 B1 | 5/2003 | Bae | |
| 6,657,787 B1 | 12/2003 | Otaki | |
| 7,108,946 B1 * | 9/2006 | Lukanc et al. | 430/22 |
| 2002/0172901 A1 | 11/2002 | Tokushima | |
| 2003/0031937 A1 * | 2/2003 | Yan | 430/5 |
| 2003/0081316 A1 | 5/2003 | Goldberg et al. | |
| 2003/0081722 A1 * | 5/2003 | Kandaka et al. | 378/70 |
| 2003/0147058 A1 * | 8/2003 | Murakami et al. | 355/53 |
| 2004/0095645 A1 * | 5/2004 | Pellicori et al. | 359/584 |
| 2004/0095662 A1 * | 5/2004 | Masaki et al. | 359/883 |
| 2004/0184019 A1 * | 9/2004 | Totzeck et al. | 355/71 |
| 2005/0019675 A1 * | 1/2005 | Hendriks et al. | 430/5 |
| 2005/0122589 A1 * | 6/2005 | Bakker | 359/591 |
| 2005/0146701 A1 | 7/2005 | Holderer et al. | |
| 2005/0157384 A1 * | 7/2005 | Shiraishi et al. | 359/359 |
| 2005/0264779 A1 * | 12/2005 | Hasegawa et al. | 355/53 |

FOREIGN PATENT DOCUMENTS

| | | |
|---|---|---|
| JP | H11-354404 A | 12/1999 |
| JP | 2000-150340 | 5/2000 |
| JP | 2001-060003 | 3/2001 |
| JP | 2004-080021 | 3/2004 |
| JP | 2005-524237 | 8/2005 |
| KR | 2004-0011380 A | 2/2004 |
| WO | WO 02/48796 | 6/2002 |
| WO | WO 2004/077162 | 9/2004 |

OTHER PUBLICATIONS

S.R.J. Brueck, "Optical and Interferometric Lithography-Nanotechnology Enablers," Proceedings of the IEEE, vol. 93, No. 10, Oct. 2005, pp. 1704-1721.

Sang-In Han et al., "Design and Method for Fabricating Phase Shift Masks for Extreme Ultraviolet Lithography by Partial Etching into the EUV Multiplayer Mirror," Proceedings of the SPIE—The International Society for Optical Engineering SPIE—Int. Soc. Opt. ENG USA, vol. 5037, Feb. 25, 2003, pp. 314-330.

Sergiy Yulin et al., "Development of high-temperature $MoSi_2/Si$ and Mo/C/Si/C multilayer mirrors," Fraunhofer IOF Annual Report, 2004, p. 69.

Xiaobo Yin et al., "Near-field two-photon nanolithography using an apertureless optical probe," Applied Physics Letters, vol. 81, No. 19, Nov. 4, 2002, pp. 3663-3665.

V. F. Canales et al. "Three-dimensional control of the focal light intensity distribution by analytically designed phase masks", Optics Communications 247 (2005) 11-18.

English translation of Office Action from corresponding Japanese patent application No. 2009-506970, dated Jan. 10, 2012.

Japanese Office Action, with English translation thereof, for corresponding Appl No. 2009-506970, dated Apr. 15, 2013.

Korean Office Action, with English translation thereof, for corresponding Appl No. 10-2008-7025770, dated May 29, 2013.

* cited by examiner

PROJECTION EXPOSURE SYSTEM AND USE THEREOF

CROSS-REFERENCE TO RELATED APPLICATIONS

This application is a continuation application of International Application No. PCT/EP2007/003605, filed Apr. 24, 2007, which claims the benefit of German Application No. 10 2006 018 928.0, filed on Apr. 24, 2006. The contents of international application PCT/EP2007/003605 are hereby incorporated by reference.

FIELD

The disclosure generally relates to a projection exposure system for imaging an object field arranged in an object plane to an image field of an image plane, as well as related systems, components and methods.

BACKGROUND

Lithographic methods are conventionally employed for manufacturing miniaturized structures and components. The miniaturized components and structures include, for example, integrated circuits, liquid crystal elements, micromechanical components and the like. Patterns, respectively structures, predefined on a mask (reticle) can be imaged to a radiation sensitive substrate, such as, for example, a wafer having a radiation sensitive layer (resist), via imaging optics of a projection exposure system. The exposed radiation sensitive layer can be subsequently developed, and the exposed or unexposed regions of the radiation sensitive layer can be detached from the underlying wafer. At the detached regions, the surface of the wafer can be accessible for subsequent process steps, while the undetached regions can be protected from the subsequent process steps. The subsequent process steps include, for example, etching, oxidizing, implanting, depositing additional layers and the like.

Often, the smallest structure size which can be manufactured in such a lithography method is characterized by the generally known formula $k*\lambda/NA$, where NA is the image side numerical aperture of the imaging optics, $\lambda$ is the light wavelength used for imaging, and k is a parameter given by the process.

SUMMARY

In some embodiments, the disclosure provides a projection exposure system with relatively high resolution, and/or a projection exposure system with a relatively high process parameter k.

In some embodiments, the disclosure provides a projection exposure system for imaging an object field arranged in an object plane to an image field of an image plane. The projection exposure system includes a mask holder for optionally holding a mask from a plurality of masks in an object plane. The projection exposure system also includes catoptric imaging optics for transferring a pattern defined by the mask arranged in the object plane to an image plane of the imaging optics. The imaging optics includes a plurality of mirrors. At last one of the mirrors is a mirror formed as a phase mask, wherein this mirror includes a substrate having a surface on which a plurality of dielectric layers are provided. The surface of the substrate includes continuous regions extending parallel to a layer direction of the dielectric layer provided thereon. Adjacent regions are separated from each other by surface portions extending transverse to the layer direction.

In certain embodiments, catoptric imaging optics includes only mirrors for imaging an object using light. This can be advantageous, for example, when light having very short wavelengths, such as ultraviolet light or extreme ultraviolet light (EUV), is used for imaging. Light having such short wavelength can be strongly absorbed by transmissive optical elements while concurrently being only weakly refracted. In lithography, use of light having very short wavelengths compared with use of light having larger wavelengths can diminish a smallest structure size of structures or components manufactured via the lithography system. When a mirror formed as phase mask is integrated in a lithography system having catoptric imaging optics, the maximum of the point spread function in the imaging optics having a resolution limited by the aperture may be narrowed.

The term phase mask denotes in the context of the present disclosure a structure having different subregions that differently influence the phase of the imaging radiation interacting with the subregions. However, it is not excluded that also the amplitudes of the imaging radiation interacting with the different subregions are differently influenced. It is possible to configure the individual subregions such that, in addition to the effect on the phase of the radiation interacting with the subregions, their amplitudes are influenced so that the overall imaging result is further improved and so that, for example, the axial extension of the image of a point is further increased or/and the lateral extension of an image of a point is further decreased.

In some embodiments, a mirror formed as a phase mask can have a relatively simple construction and may be manufactured using conventional lithographic techniques.

In certain embodiments, the mirror formed as a phase mask has the same number of dielectric layers provided on a plurality of the continuous regions of the surface of the substrate. As a result, the structuring of the provided layers can be according to a structuring of the continuous regions of the surface of the substrate.

In some embodiments, the regions of the surface of the mirror formed as phase mask are regions protruding from the substrate regions and lowered in the substrate, alternately. A lowered region of the surface is understood within this application as a region that is at least partly surrounded from one or several other surfaces of the substrate such that at least some of the other surfaces protrude from an average surface of the substrate. A protruding region is complementary to a lowered region. By this arrangement a simple structure can result that can be relatively easy to manufacture.

In certain embodiments, the disclosure provides a projection exposure system for imaging an object field arranged in an object plane to an image field of an image plane. The projection exposure system includes a mask holder for optionally holding a mask from a plurality of masks in an object plane. The projection exposure system also includes catoptric imaging optics for transferring a pattern defined by the mask arranged in the object plane to an image plane of the imaging optics. The imaging optics includes a plurality of mirrors. At least one of the mirrors is a mirror formed as phase mask that includes a substrate having a surface on which a plurality of dielectric layers are provided. The mirror has adjacently arranged continuous regions differing with respect to a number of dielectric layers provided on the substrate.

In some embodiments, adjacently arranged regions of the mirror formed as phase mask alternately exhibit a greater and a smaller number of dielectric layers provided on the substrate. This can result in a relatively simple reflective diffractive element, which may be manufactured by, for example, lithographic methods.

In certain embodiments, the regions of the mirror formed as phase mask have elongated stripes. The elongated strips may extend along circular lines around an optical axis of the imaging optics. Such embodiments may be beneficial, for example, for rotationally symmetric imaging optics.

In some embodiments, the mirror may have greater than 50 (e.g., greater than 100) different regions.

In certain embodiments, the dielectric layers may be MoSi-layers. MoSi-layers in the context of this application include layers of Mo, Si, $MoSi_2$ and $Mo_5Si_3$. These layers may be alternately arranged or arranged including further interface layers. As protection or interface layers binary compositions of Mo and Si with B, C, N, O, F may be employed.

In some embodiments, the regions of the mirror formed as phase mask are configured to relatively increase an axial extension of an image of a point (DOF) of the imaging of the imaging optics and/or to decrease a lateral extension of an image of a point of the imaging of the imaging optics. By appropriately configuring the mirror formed as phase mask it is thereby possible to relatively diminish side maxima of the point spread function to such a degree that after exposing a wafer the exposure threshold of the resist can be exceeded only in the region of the main maximum which is smaller, when the mirror formed as phase mask is inserted, than the maximum for resolution limited by the aperture. Consequently an appropriate mirror formed as phase mask may contribute to an increase of the resolution achievable with the lithographic process.

In certain embodiments, the mirror formed as phase mask is arranged close to a pupil of the imaging optics. "Close to pupil" denotes in the context of the present disclosure that a distance along the beam path between the pupil and the mirror formed as phase mask and arranged close to the pupil is smaller than 0.3 times (e.g., smaller than 0.2 times) a distance between the pupil and a field plane arranged closest to the pupil. "Distance along the beam path" denotes for a catoptric system that the beam path traversing between mirrors back and forth is unfolded to obtain an unfolded beam path running in one direction. In this unfolded beam path a distance between elements of the system is then measured. At the mirror formed as phase mask and arranged close to the pupil, rays of the beam path can impinge substantially in a parallel manner onto the mirror formed as phase mask, so that the mirror formed as phase mask can have an effect on the imaging of a point that is substantially independent of a location of the imaged point in the object field, respectively image field.

In some embodiments, the disclosure provides a lithography method using a projection exposure system as described herein. Multiple masks can be used to expose the substrate with multiple different predetermined radiation intensity distributions. Multiple different mirrors formed as phase masks can be provided, wherein every mask can be associated with a mirror formed as phase mask so that during the illuminating a first mask for the exposure of the substrate with a first predetermined radiation intensity distribution a first mirror formed as phase mask can be inserted in the imaging beam path and during the exposing a second mask for exposure of the substrate with a second predetermined radiation intensity distribution a second mirror formed as phase mask can be inserted in the imaging beam path. Because of the association between the masks and the mirrors formed as phase masks it is possible to configure the respective mirror formed as phase mask such that the result of a desired radiation intensity distribution according to the properties of the respective mask can be achieved in a best possible manner.

The exposure with the different predetermined radiation intensity distributions may occur on the same radiation sensitive layer (resist) of the substrate. Accordingly, multiple exposures of the radiation sensitive layer with different predetermined radiation intensity distributions may be performed.

Additionally or alternatively, the different radiation intensity distributions may be exposed on different radiation sensitive layers in consecutive process steps of the lithography method.

In certain embodiments, the same radiation sensitive layer of the substrate is subsequently exposed with different radiation intensity distributions (multiple exposures are performed). Optionally, different masks can be arranged in the object plane so that, for all exposures, the same mirror formed as phase mask is arranged in the imaging beam path.

In some embodiments, two, three or more different radiation intensity distributions are exposed successively on the same radiation sensitive layer.

BRIEF DESCRIPTION OF THE FIGURES

Embodiments of the disclosure are explained below with respect to figures, in which.

DETAILED DESCRIPTION

Figure 1:
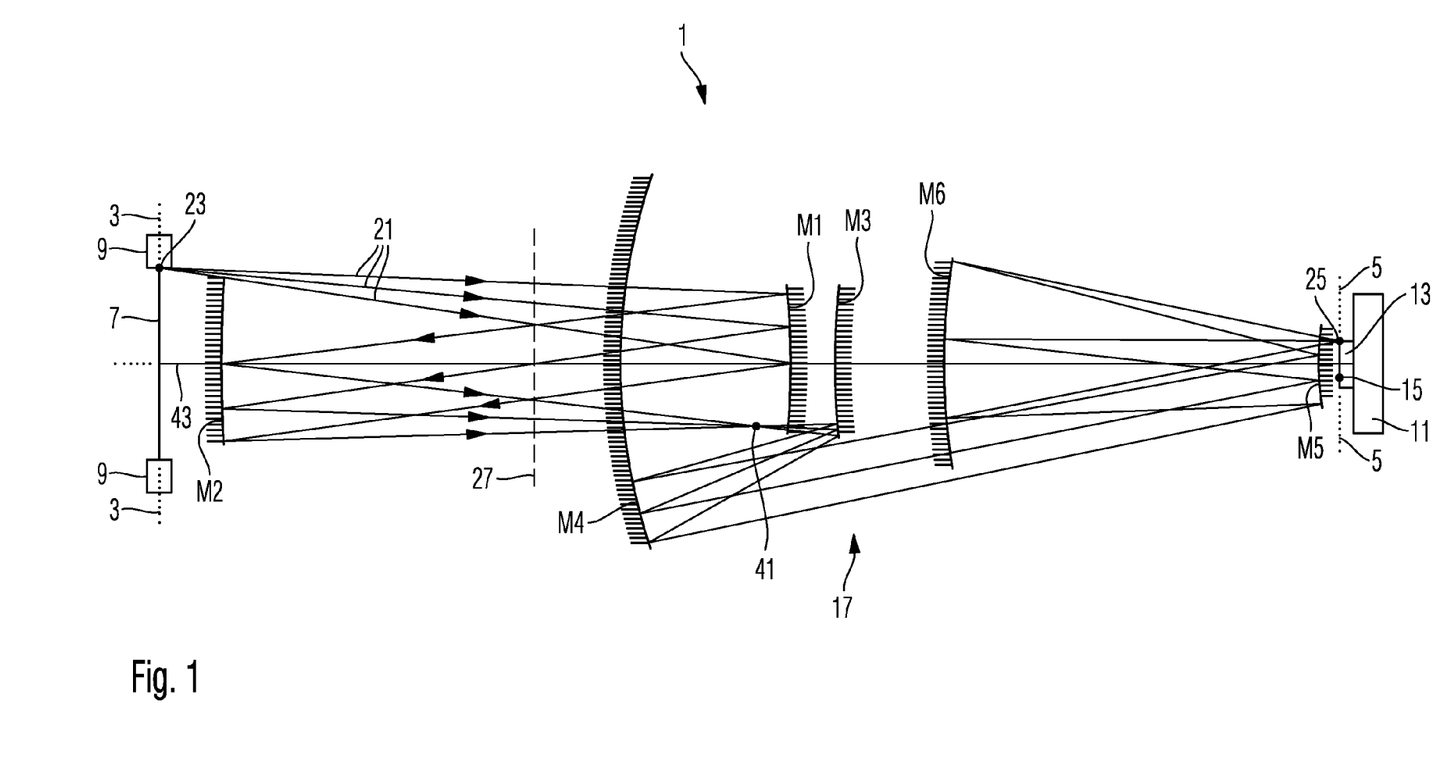
FIG. 1 is a schematic view of a projection exposure system including mirrors as optical elements.

FIG. 1 is a schematic illustration of a projection exposure system 1 for imaging, in a demagnified manner, an object plane 3 in which a mask 7 is arranged to an image plane 5 in which a surface 15 of a semiconductor wafer 13 is arranged. In the object field 3 a mask 7 is held at a mask holder 9 such that pattern forming structures of the mask 7 are arranged in the object plane 3. At a wafer table 11 a semiconductor wafer 13 is held such that a surface 15 of the wafer provided with a radiation sensitive layer (resist) is arranged in the imaging plane 5.

Catoptric imaging optics 17 includes a plurality of mirrors for providing an imaging beam path which is illustrated in FIG. 1 by three exemplary rays 21. The rays emanate in different angles from an exemplary point 23 in the object plane 3 and image this point 23 to a point 25 in the image plane 5. A pupil plane of the imaging optics 17 is denoted in FIG. 1 as reference sign 27.

The imaging optics 3 includes six mirrors M1, M2, M3, M4, M5 and M6 at which the imaging beam path 21 starting from the object plane 3 is successively reflected to project a pattern defined by the mask 7 into the image plane 5. Herein the imaging optics 3 is configured such that an intermediate image is generated between the object plane 3 and the image plane 5, wherein a point 41 exemplarily indicated in FIG. 1 is located in the corresponding intermediate image plane.

The mirror faces of the mirrors M1, M2, ... M6 are respectively formed rotationally symmetric with respect to a common optical axis 43, wherein the beam path itself however is not formed rotationally symmetric with respect to the common axis 43. Accordingly the individual mirrors are "off-axis-mirrors" which are truncated such that these portions of the beam path not reflected at a corresponding mirror can pass this mirror and are not blocked by the mirrors.

Figure 2:
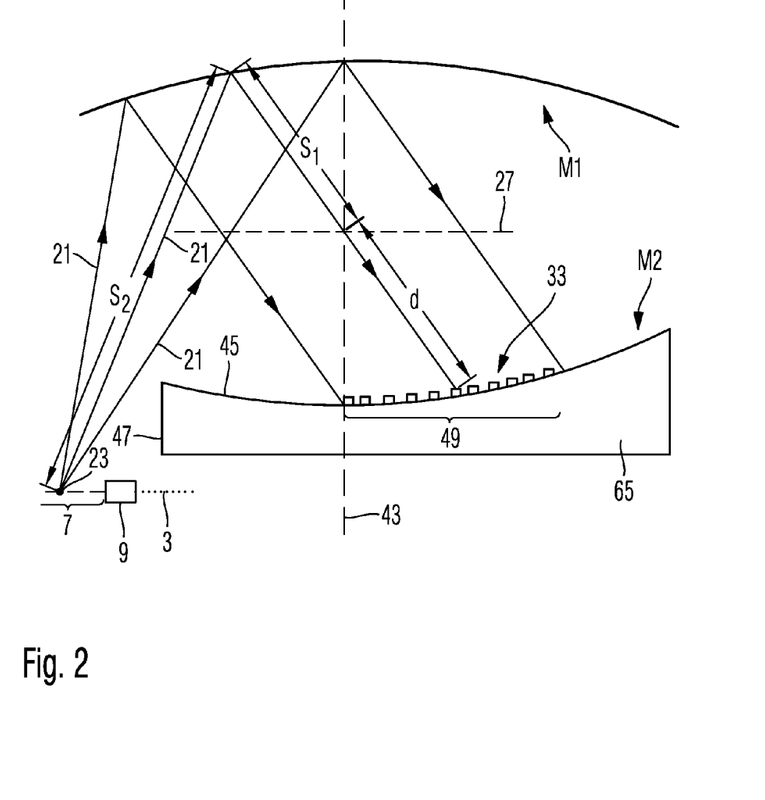
FIG. 2 is a schematic partial view of the projection exposure system including a mirror formed as phase mask.

FIG. 2 is a partial view of the projection exposure system of FIG. 1 including a schematic sectional view of the mirror M2 of FIG. 1. The mirror M2 is a mirror formed as a phase mask 33. Referring to FIGS. 1 and 2 the mirror M2 formed as phase mask includes adjacently arranged reflective regions effecting that rays 21 reflected at different regions of the mirror traverse different optical path lengths so that rays being reflected at different regions of the mirror M2 formed as phase mask experience phase shifts relative to each other. The phase mask 33 is arranged close to the pupil plane 27. As viewed in direction of the imaging beam path the mirror M2 is arranged much less distant from a pupil 27 arranged between the object plane 3 and the intermediate image plane 41 than the pupil itself from the object plane 3 or from the intermediate image plane 41. A distance d between the pupil plane and the mirror M2 is considerably smaller than a distance (the sum of the distances S1 and S2 in FIG. 2) from the pupil plane 27 along the beam path 21 to the object plane 3.

Referring to FIG. 2 a mirror surface 45 of the mirror M2 is rotationally symmetric with respect to the axis 43. The mirror M2 is truncated along an edge 47 in order not to block the beam path. The beam path impinges in a region 49 of the mirror surface 45 and is reflected in the region 49 from the mirror surface 45. The phase mask 33 is attached to the mirror surface 45 in the region 49. The phase mask 33 is configured such at an axial extension of an image of a point is, due to the presence of the phase mask in the beam path, larger than compared to a situation in which the phase mask is not arranged in the imaging beam path. Additionally or alternatively, the phase mask may be configured such that a lateral extension of an image of a point of the imaging is, due to the presence of the phase mask in the imaging beam path, smaller as compared to a situation in which the phase mask is not arranged in the imaging beam path.

Figure 3:
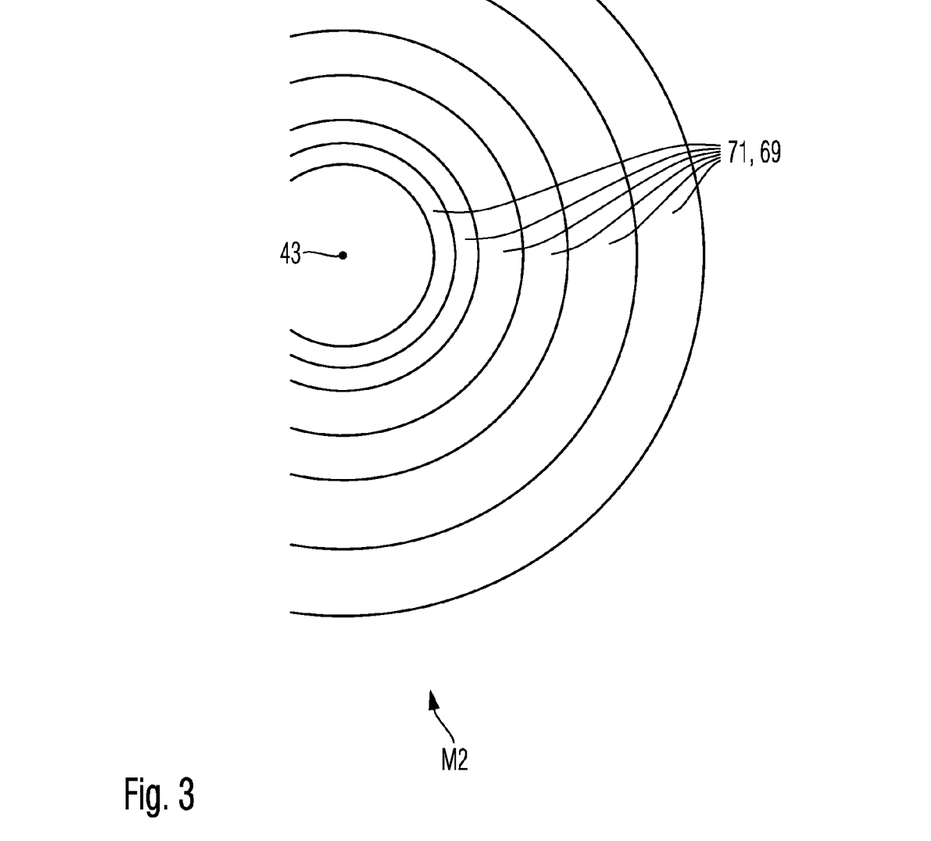
FIG. 3 is a schematic a mirror formed as phase mask.

FIG. 3 shows an embodiment of the mirror M2 in a plan view as seen along the optical axis 43. The continuous regions (69, 71) from which impinging light rays can be reflected after traversing different optical path lengths are arranged in a form of stripes adjacent to each other. The regions can extend along circular lines having their center point at the optical axis 43.

Computing methods for designing a mirror formed as phase mask and manufacturing methods for creating a mirror formed as phase mask are known from other areas of optics so that this knowledge can be used to create mirrors formed as phase masks suitable for the present application in the area of lithography optics. As an example, relevant disclosure is provided by V. F. Canales et al. "Three-dimensional control of the focal light intensity distribution by analytically designed phase masks", Optics Communications 247 (2005) 11-18, US 2003/0,081,316 A1 and U.S. Pat. No. 5,917,854.

FIGS. 4a to 4d schematically show steps of a manufacturing method of a mirror formed as phase mask used in a projection exposure system. The mirror M2 formed as phase mask which is to be manufactured is illustrated in a side view, that means during use of the mirror M2 in a projection exposure system a direction of light impingement lies within the drawing plane of FIG. 4a to 4d.

Figure 4A:
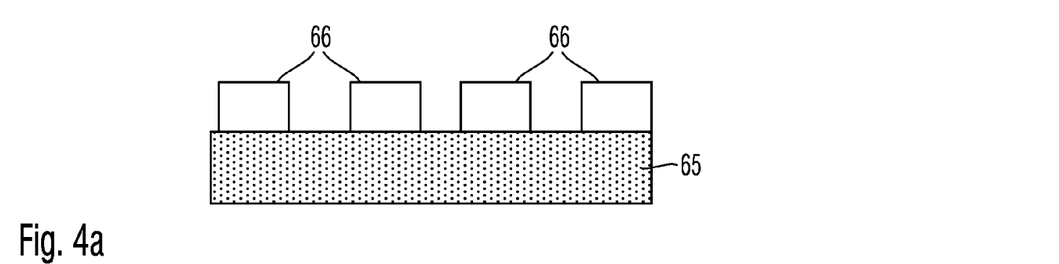
FIGS. 4a-4d schematically represent a manufacturing method of a mirror formed as a phase mask.
Figure 4B:
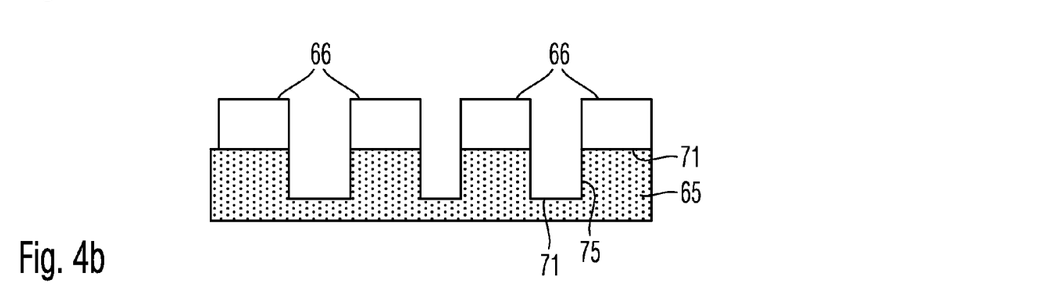
Figure 4C:
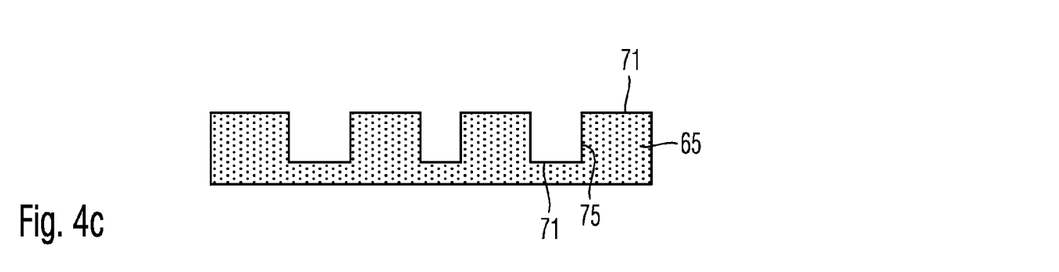
Figure 4D:
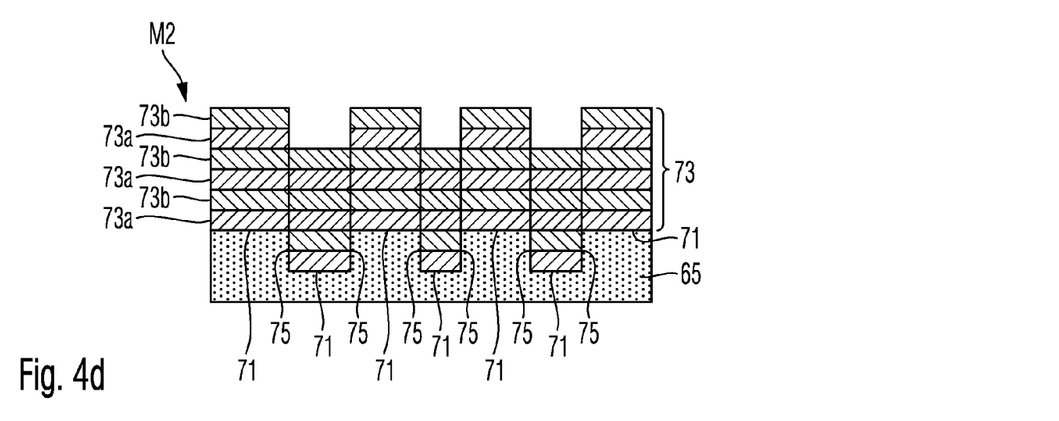

In FIG. 4a a resist 66 is attached to a substrate 65 according to a pattern. In the subsequent step illustrated in FIG. 4b portions of the substrate 65 not covered by resist 66 are partly edged away to form regions 71 of a surface of the substrate 65. Adjacent regions 71 are thereby separated by surface portions 75 from each other. Thereafter the resist pattern is removed, as illustrated in FIG. 4c. In a final step illustrated in FIG. 4d a plurality of dielectric layers 73 are attached on the regions 71 of the surface of the substrate. In the illustrated example the dielectric layers 73 include two materials 73a and 73b having different dielectric properties and thus having different optical refractive indices. A multilayer 73 is thereby formed by alternatingly attaching the two different materials on the regions 71 of the surface of the substrate 65. Layers of Mo, Si, $MoSi_2$ and $Mo_5Si_3$ may be used as materials having different dielectric properties. Instead of Si also Y or Be may be employed. These layers may alternately arranged or arranged further including interface layers. As protection or interface layers binary compositions of Mo and Si with B, C, N, O, F, such as C, N and O may be employed. C may be employed as an interface layer. In some embodiments, multilayer 73 includes on the order of 40 layers are attached in total, with each layer having a thickness of 3 to 4 nm.

FIGS. 5a to 5d schematically show steps of a manufacturing method of a mirror M2' formed as phase mask in a projection exposure system. The orientation of the mirror M2' is the same as the orientation of the mirror M2 of FIGS. 4a to 4d.

Figure 5A:
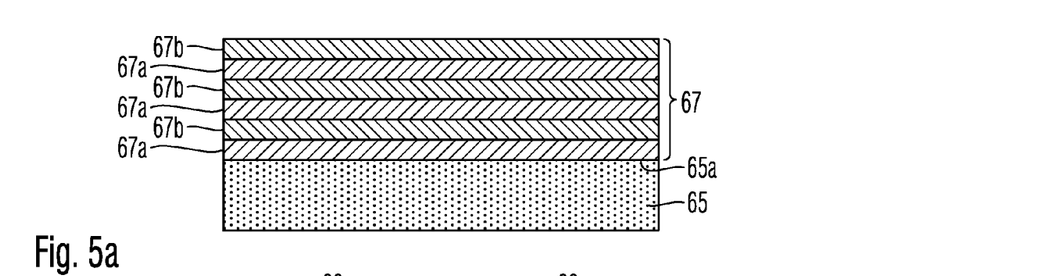
FIGS. 5a-5d schematically represent a manufacturing method of a mirror formed as phase mask.
Figure 5B:
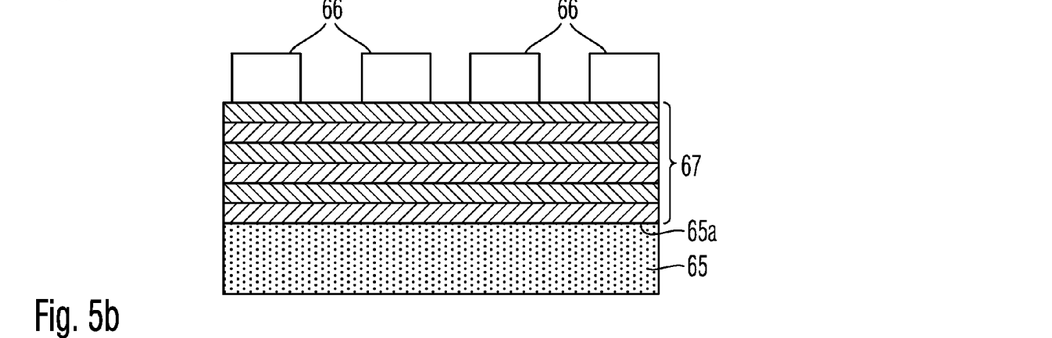
Figure 5C:
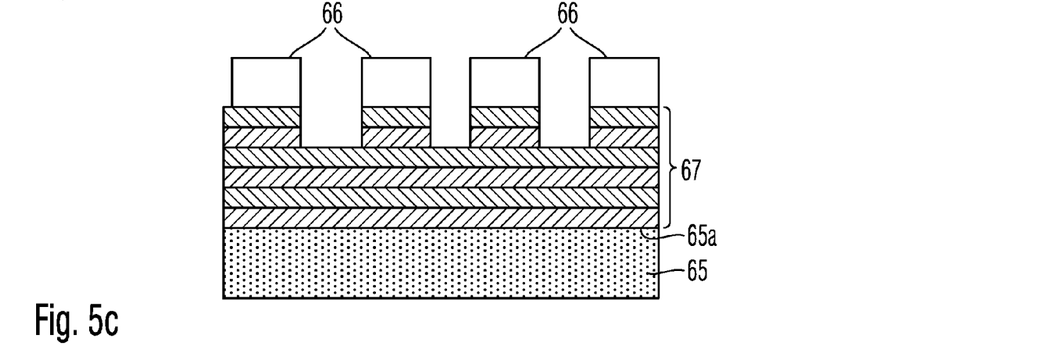
Figure 5D:
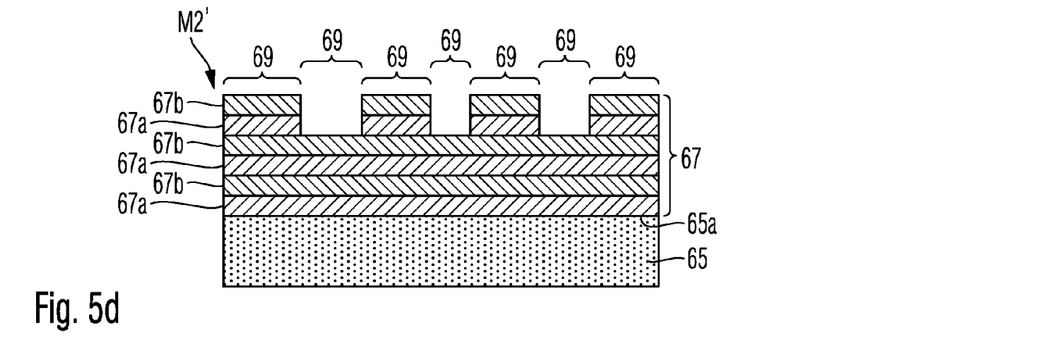

As illustrated in FIG. 5a, initially a multilayer 67 is attached on a surface 65a of the substrate 65, wherein the multilayer 67 is constructed from alternating dielectric layers 67a and 67b of two materials having different dielectric properties. FIG. 5b shows a step after attaching a resist 66 according to a pattern on the multilayer 67. FIG. 5c illustrates a state after partly etching away the multilayer 67 in regions of the multilayer not covered by resist 66. After removing the resist a mirror M2' formed as phase mask is obtained. The mirror M2' exhibits adjacently arranged regions 69 differing with respect to a number of dielectric layers 67 attached on the substrate 65. Materials and thicknesses of the dielectric layers may be chosen as described in the embodiments described with reference to FIG. 4.

Referring again to FIG. 1, in addition or alternatively to the phase mask 33 arranged on the mirror surface 45, a phase mask may also be attached on a surface of the mirror M5 which is also arranged close to a further pupil arranged between the intermediate image plane 41 and the image plane 5.

Figure 6A:
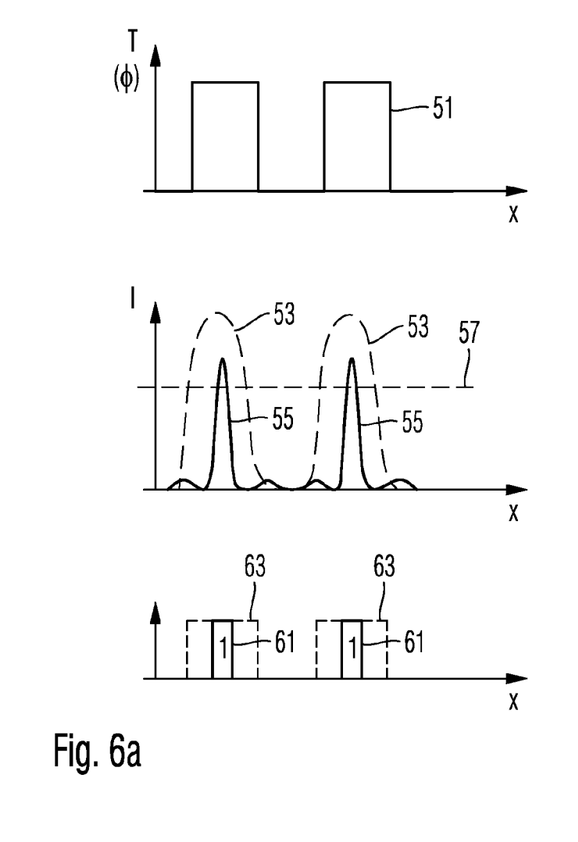
FIGS. 6a and 6b schematically represent process steps of a lithography method.
Figure 6B:
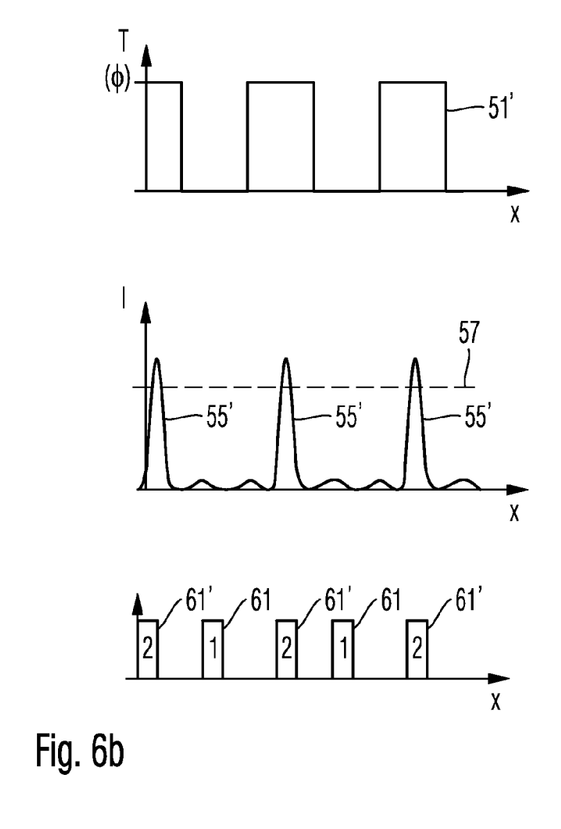

The FIGS. 6a and 6b serve for explanation of a lithography method according to an embodiment of the disclosure. Indicated by a line 51 FIG. 6a schematically shows in the upper diagram a structure of a mask arranged in an object plane of a lithography system. In the graph of the chosen example a transmission T of the mask is plotted upwards and a lateral position coordinate of the mask is plotted to the right, wherein the mask is formed as absorption mask. Likewise, the mask could be formed as phase mask generating a phase shift Φ having a corresponding course.

In the graph in the middle of FIG. 6a a radiation intensity course is illustrated using a dashed line 53 which would result in the object plane if no phase mask were arranged on a mirror in the vicinity of the pupil in the imaging beam path, while a solid line 55 represents a radiation intensity distribution resulting in the object plane, when the mirror formed as phase mask is arranged in the beam path. In the illustration of FIG. 6a a demagnification of the imaging of the object plane to the image plane, employed in practice, is not accounted for due to the more clear illustration, so that points of the object plane and of the image plane corresponding to each other upon imaging are arranged in FIG. 6a vertically below each other.

A line 57 in the graph in the middle of FIG. 6a represents an exposure threshold of a resist attached on the wafer surface, wherein the resist is exposed completely, if the radiation intensity directed thereon exceeds the threshold 57. The width of the regions that exceed threshold 57 for line 55 is considerably less than the width of the regions that exceed threshold 57 for line 53. Consequently, structures symbolized in the lower graph of FIG. 6a by solid lines 61 which can be manufactured in the wafer after exposure having the phase mask arranged on a mirror are considerably smaller than structures symbolized as dashed lines 63 after exposure without having the phase mask arranged on a mirror.

Thus, the exposure by the phase mask arranged in the imaging optics results in a diminishing of smallest possible structures 61 producible with a given mask. For such a given mask structure 51 it may not be possible to further diminish a distance between adjacent structures 61. However it is possible, in the context of a second exposure with a mask structure 51' different from the mask structure 51, to insert further structures 61' between the structures 61 produced by the first exposure. This is schematically illustrated in FIG. 6b. Therein line 51' in the upper graph represents a structure of a second mask that is offset in a lateral direction compared to the structure 51 of FIG. 6a. The mask structure 51' produces in the object plane an intensity distribution 55' illustrated in the graph in the middle of FIG. 6b, wherein the intensity distribution 55' exceeds at its maxima the threshold 57 of the resist so that at corresponding locations on the wafer structures 61' can be generated on the wafer in a subsequent process so that structures 61' are arranged between the structures 61 resulting from an exposure in the first exposure step illustrated in FIG. 6a.

Thus, it is possible to achieve a considerable increase of the resolution (diminishing of the structures) available due to the combination of the arrangement of the mirror formed as phase mask in the imaging beam path and performing two exposure steps.

Figure 7A:
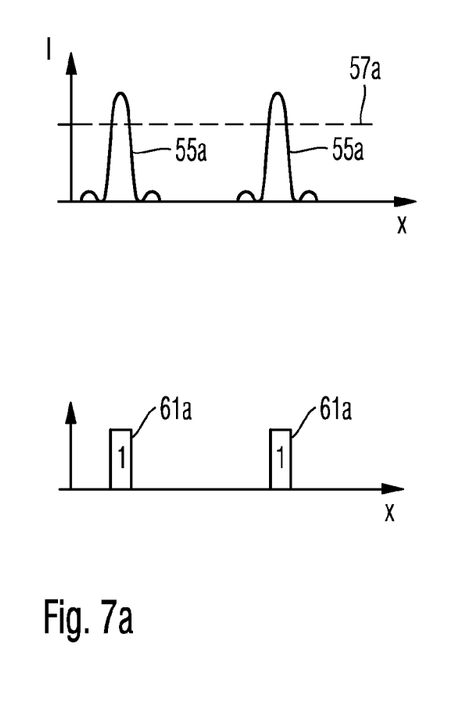
FIGS. 7a-7c schematically represent process steps of the lithography method.
Figure 7B:
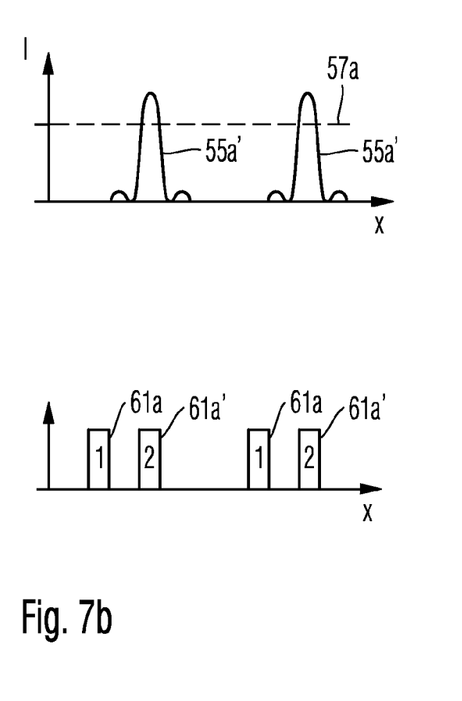
Figure 7C:
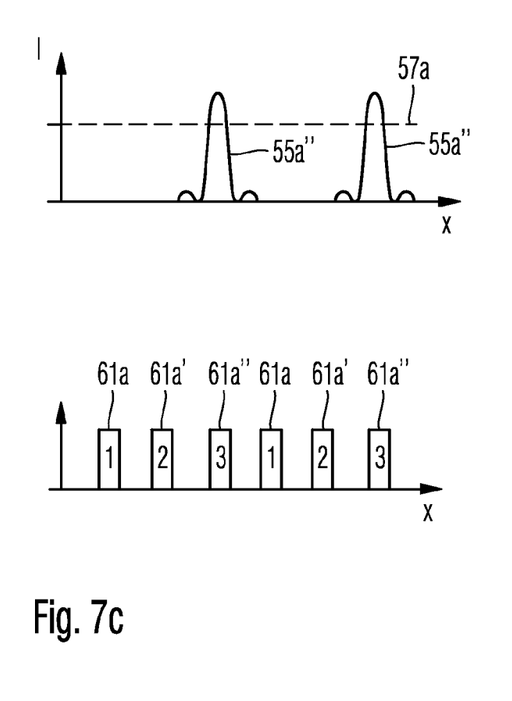

This method is not limited to performing two successive exposures with different masks. The FIGS. 7a, 7b and 7c schematically illustrate in analogy to the FIGS. 6a and 6b a lithography method in which successively three exposures of a same resist are performed to further increase a density of the manufactured structures.

A lithography method is disclosed that employs a projection exposure system having catoptric imaging optics that include a mirror formed as phase mask in the imaging beam path. The mirror can exhibit continuous regions having dielectric layers attached thereon. Optionally, the regions of the mirror formed as a phase mask are configured such that an axial extension of an image of a point (DOF) of the imaging is increased or/and a lateral extension of an image of a point of the imaging is decreased. Optionally, multiple exposures of a same radiation sensitive substrate are performed to achieve an increase of the resolution and a diminishing of the manufactured trace structures, respectively.

What is claimed is:

1. A system, comprising:
   catoptric imaging optics configured to image an object field in an object plane to an image field in an image plane, the catoptric imaging optics comprising a plurality of mirrors, the plurality of mirrors comprising a mirror that comprises a phase mask, the phase mask comprising a substrate and a plurality of dielectric layers on a surface of the substrate,
   wherein:
   the plurality of dielectric layers is stacked so that one dielectric layer is positioned on top of another dielectric layer in a first direction which is substantially perpendicular to the surface of the substrate;
   the surface of the substrate comprises regions extending perpendicular to the first direction;
   adjacent regions of the surface of the substrate are separated from each other by portions of the surface of the substrate extending parallel to the first direction so that the adjacent regions of the surface of the substrate are separated from each other in a direction parallel to the first direction;
   the regions of the surface of the substrate extending perpendicular to the first direction support the dielectric layers;
   the portions of the surface of the substrate extending parallel to the first direction contact multiple dielectric layers; and
   the system is configured to be used in a lithography system.

2. The system according to claim 1, further comprising a holder configured to hold a mask in the object plane of the catoptric imaging optics.

3. The system according to claim 1, wherein the phase mask has the same number of dielectric layers as regions of the surface of the substrate.

4. The system according to claim 1, wherein alternating regions of the surface of the substrate protrude from the substrate and are lowered in the substrate, respectively.

5. The system according to claim 1, wherein the regions of the surface of the substrate are elongated stripes.

6. The system according to claim 5, wherein the regions extend along circular lines around an optical axis of the catoptric imaging optics.

7. The system according to claim 1, wherein the surface of the substrate has more than 50 regions.

8. The system according to claim 1, wherein the dielectric layers comprise MoSi-layers.

9. The system according to claim 1, wherein the phase mask is configured to increase an axial extension of an image of a point of imaging in the image field of the catoptric imaging optics.

10. The system according to claim 1, wherein the phase mask is configured to decrease a lateral extension of an image of a point of imaging in the image field of the imaging optics.

11. The system according to claim 1, wherein the mirror is close to a pupil of the catoptric imaging optics.

12. The system according to claim 11, wherein a distance between the mirror and a pupil plane along an optical axis of the imaging system is less than 0.3 times a distance between the pupil plane and a field plane arranged closest to the pupil plane.

13. The system according to claim 1, wherein a distance between the mirror and a pupil plane along an optical axis of the imaging system is less than 0.3 times a distance between the pupil plane and a field plane arranged closest to the pupil plane.

14. A method, comprising using:
   providing the system of claim 1;
   arranging a first mask at the object plane;
   illuminating the mask to expose the substrate with a first radiation intensity distribution;
   arranging a second mask at the object plane, the second mask being different from the first mask;
   arranging a different mirror formed as a phase mask in the imaging beam path of the system; and illuminating the second mask to expose the substrate with a second predetermined radiation intensity distribution.

15. The method according to claim 14, further comprising:
developing an exposed radiation sensitive layer of the substrate after the exposing with the first radiation intensity distribution;
processing the substrate; and
attaching another radiation sensitive layer on the substrate before the exposing with the second radiation intensity distribution.

16. A method, comprising:
providing the system of claim 1;
arranging a mask at the object plane;
illuminating the mask to expose the substrate with a first radiation intensity distribution;
arranging a second mask at the object plane, the second mask being different from the first mask;
illuminating the second mask to expose the substrate with a second radiation intensity distribution,
wherein a same radiation sensitive layer of the substrate is exposed with the first and second radiation intensity distributions.

17. The method according to claim 16, further comprising:
arranging a third mask at the object plane, the third mask being different from the first and second masks; and
illuminating the third mask to expose the same radiation sensitive layer of the substrate further with a third predetermined radiation intensity distribution.

18. The system according to claim 1, wherein the surface of the substrate is stepped with adjacent regions of the substrate offset in a direction parallel to the first direction.

19. The system according to claim 1, wherein:
the regions comprise a first region and a second region;
a line passes and is parallel to the surface of the first region; and
the line passes and is parallel to the surface of the second region.

20. The system according to claim 1, wherein the portions of the surface of the substrate extending parallel to the first direction have their entire surfaces contacting the multiple dielectric layers.

* * * * *